(12) United States Patent
Roy et al.

(10) Patent No.: US 7,017,086 B2
(45) Date of Patent: *Mar. 21, 2006

(54) ROUND-ROBIN UPDATING FOR HIGH SPEED I/O PARALLEL INTERFACES

(75) Inventors: Aninda K. Roy, San Jose, CA (US); Claude R. Gauthier, Fremont, CA (US); Brian W. Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 419 days.

This patent is subject to a terminal disclaimer.

(21) Appl. No.: 10/174,045

(22) Filed: Jun. 18, 2002

(65) Prior Publication Data
US 2003/0233608 A1 Dec. 18, 2003

(51) Int. Cl.
*G01R 31/28* (2006.01)

(52) U.S. Cl. .................. 714/712; 714/731; 714/744; 713/400; 702/89

(58) Field of Classification Search ............... 714/798, 714/744, 731, 712, 715, 740, 821, 709, 707, 714/742, 799, 819, 89, 12, 30, 47, 48, 724, 714/745; 370/503; 713/400; 702/89; 375/213, 375/221
See application file for complete search history.

(56) References Cited

U.S. PATENT DOCUMENTS

| | | | |
|---|---|---|---|
| 4,451,916 A | * | 5/1984 | Casper et al. .................. 714/4 |
| 4,531,185 A | * | 7/1985 | Halpern et al. ............. 713/375 |
| 4,542,380 A | | 9/1985 | Beckner et al. |
| 4,545,013 A | | 10/1985 | Lyon et al. |
| 4,562,573 A | | 12/1985 | Murano et al. |
| 4,731,588 A | | 3/1988 | Addis et al. |
| 5,574,753 A | * | 11/1996 | Vartti et al. ................. 375/357 |
| 5,844,762 A | | 12/1998 | Yamamura et al. |
| 5,956,349 A | | 9/1999 | Watanabe et al. |
| 5,963,023 A | | 10/1999 | Herrell et al. |
| 6,108,795 A | * | 8/2000 | Jeddeloh ..................... 713/401 |
| 6,345,365 B1 | | 2/2002 | Takahashi et al. |
| 6,400,724 B1 | | 6/2002 | Yao |
| 6,453,402 B1 | * | 9/2002 | Jeddeloh ..................... 711/167 |
| 6,463,109 B1 | | 10/2002 | McCormack et al. |

(Continued)

OTHER PUBLICATIONS

Na et al., "The Effects of On-Chip and Package Decoupling Capacitors and an Efficient ASIC Decoupling Methodology", IEEE, 2004.

(Continued)

*Primary Examiner*—Albert Decady
*Assistant Examiner*—John P. Trimmings
(74) *Attorney, Agent, or Firm*—Osha Liang LLP

(57) ABSTRACT

A technique for adjusting a communication system involves a plurality of links where each link includes a data line adapted to transmit a data signal and a clock line adapted to transmit a clock signal. A test circuit connects to the plurality of links where the test circuit tests at least one of the plurality of links. The test circuit includes an adjustment circuit arranged to generate an adjustable clock signal from the clock signal of the one of the plurality of links based on an offset where the adjustment circuit adjusts a timing of the adjustable clock signal relative to the data signal of the one of the plurality of links. The test circuit is adapted to perform a round-robin testing of the plurality of the links.

25 Claims, 7 Drawing Sheets

U.S. PATENT DOCUMENTS

| | | | |
|---|---|---|---|
| 6,629,257 B1 * | 9/2003 | Hartwell | 713/502 |
| 6,700,390 B1 | 3/2004 | Gauthier et al. | |
| 6,781,355 B1 | 8/2004 | Gauthier et al. | |
| 6,801,989 B1 * | 10/2004 | Johnson et al. | 711/167 |
| 6,822,345 B1 | 11/2004 | Gauthier et al. | |
| 6,842,351 B1 | 1/2005 | Gauthier et al. | |
| 6,909,203 B1 | 6/2005 | Gauthier et al. | |
| 2002/0010872 A1 * | 1/2002 | Van Doren et al. | 713/400 |
| 2003/0107452 A1 | 6/2003 | Novak | |
| 2003/0197430 A1 | 10/2003 | Gauthier et al. | |
| 2003/0222655 A1 | 12/2003 | Gauthier et al. | |
| 2004/0049708 A1 | 3/2004 | Thomas et al. | |
| 2004/0076025 A1 | 4/2004 | Gauthier et al. | |
| 2004/0123166 A1 | 6/2004 | Gauthier et al. | |
| 2004/0124715 A1 | 7/2004 | Huang et al. | |
| 2004/0165406 A1 | 8/2004 | Gauthier et al. | |
| 2004/0169571 A1 | 9/2004 | Chang et al. | |
| 2005/0110551 A1 | 5/2005 | Bonaccio et al. | |

OTHER PUBLICATIONS

Bai et al., "Simultaneous Switching Noise and Resonance Analysis of On-Chip Power Distribution Network", IEEE, 2002.

Na et al., "Modeling and Simulation of Core Switching Noise for ASICs", IEEE, 2002.

Garben et al., "Frequency Dependencies of Power Noise", IEEE, 2002.

O'Sullivan et al., "Developing a Decoupling Methodology with SPICE for Multilayer Printed Circuit Boards", IEEE, 1998.

Jong et al., "Modeling and Simulation of Switching Noise Including Power/Ground Plance Resonance for High Speed GaAs FET Logic (FL) Circuits", IEEE, 1995.

* cited by examiner

ROUND-ROBIN UPDATING FOR HIGH SPEED I/O PARALLEL INTERFACES

BACKGROUND OF INVENTION

As the frequencies of modern computers continue to increase, the need to rapidly transmit data between chip interfaces also increases. To accurately receive data, a clock signal is often transmitted to help recover the data. The clock signal determines when the data signal should be sampled by a receiver's circuits.

The transmitted clock signal may transition at the beginning of the time the data is valid; however, the receiver's circuits should latch the data during the middle of the time the data is valid. Also, the transmission of the clock signal may degrade as it travels from its transmission point. In both circumstances, a delay locked loop, or DLL, can regenerate a copy of the clock signal at a fixed phase shift from the original.

FIG. 1 shows a block diagram of a typical communication system (10). The communication system (10) includes multiple links. Each link may include multiple data lines and an associated clock line. Data lines (14) that are N bits wide connect between circuit A (12) and circuit B (34). To aid in the recovery of transmitted data on the data lines (14), a clock signal on clock A line (16) is transmitted with data signals on the data lines (14). Another link includes data lines (24) that are M bits wide and a clock Z line (26). A clock signal on the clock Z line (26) is transmitted with data signals on the data lines (24) to determine when the data signals on the data lines (24) should be latched.

Data signals on the data lines (14, 24) are transmitted from circuit A (12) to circuit B (34). Circuit A (12) and circuit B (34) could also have one or more links to transmit data from circuit B (34) to circuit A (12) along with one or more additional clock signals (not shown). Alternatively, the links between circuit A (12) and circuit B (34) could be bi-directional. The decision as to which circuit may transmit at any given time is defined by a protocol.

The data signals and clock signals transmit information from circuit A (12) to circuit B (34) under the direction of control signals. The control signals are transmitted between circuit A (12) and circuit B (34) on control lines (32) that are K bits wide. The control signals may determine on which cycle, what frequency, and/or under which operating mode the data signals and clock signals should be transmitted. The control signals may request that circuit A (12) transmit a predetermined test pattern to circuit B (34) to test and improve transmission across the link.

In FIG. 2, a block diagram of a typical receiver (200) is shown. A clock signal (201) is input to a DLL (252) so that the DLL (252) generates a phased output, clk_out signal (213). The clock signal (201) is used as an input to a voltage-controlled delay line (210) and to a phase detector (202). The phase detector (202) measures whether the phase difference between the clock signal (201) and clk_out signal (213) of the delay path is correct. An adjustment in the phase delay produces signals that control a charge pump (204). The phase detector (202) indicates that the charge pump (204) should increase or decrease its output using charge pump control signals up, U (203), and down, D (205). The charge pump (204) adds or removes charge from a capacitor $C_1$ (206), that changes a DC value at the input of a bias-generator (208). The capacitor, $C_1$ (206), is connected between a power supply, $V_{DD}$, and a control voltage, $V_{CTRL}$ (207). The bias-generator (208) produces control voltages, $V_{BP}$ (209) and $V_{BN}$ (211), in response to the control voltage, $V_{CTRL}$ (207), that control the delay of the voltage-controlled delay line (210).

The voltage-controlled delay line (210) may be implemented using current starved elements. This means that the delays are controlled by modifying the amount of current available for charging and discharging capacitances. The linearity of a voltage controlled delay line's characteristics determines the stable range of frequencies over which the DLL can operate. The clk_out signal (213) from the voltage-controlled delay line (210) provides a phase delayed copy of the clock signal (201) to other circuits.

Still referring to FIG. 2, the negative feedback of the clk_out signal (213) adjusts the delay through the voltage-controlled delay line (210) by integrating the phase error that results between the periodic input of the clock signal (201) and clk_out signal (213). The voltage-controlled delay line (210) will delay the clk_out signal (213) by a fixed amount of time such that a desired delay between the clock signal (201) and the clk_out signal (213) is maintained.

The voltage-controlled delay line (210) also has an offset signal (215). The value of the offset signal (215) determines which tap should be used in the voltage-controlled delay line (210) to generate an adjustable clock signal (251). The offset signal (215) may be an analog signal, or a serial or parallel digital signal. While the DLL maintains a fixed delay between the clock signal (201) and the clk_out signal (213), the value of the offset signal (215) adjusts the delay between the clock signal (201) and the adjustable clock signal (251). The adjustable clock signal (251) determines when to latch the incoming data signals on data line 1 (217) through data line V (219) that are Vbits wide.

The adjustable clock signal (251) may be generated from a digital or an analog delay line in place of the voltage-controlled delay line (210). In other embodiments, the adjustable clock signal (251) may be generated from a digital or an analog delay line connected to the clk_out signal (213) outside of the feedback loop. The digital or the analog delay lines in these embodiments may generate the adjustable clock signal (251) based on the value of the offset signal (215). The value of the offset signal (215) is used to determine at which point in the delay line to tap.

The data signals on data line 1 (217) through data line V (219) arrive at flip-flop (212) through flip-flop (214), respectively. The data signals on data line 1 (217) through data line V (219) are latched depending on the arrival time of the adjustable clock (251) to generate latched data signals on chip_data line 1 (221) through chip_data line V (223), respectively. Depending on the arrival time of the adjustable clock signal (251), some or all of the latched data signals may not equal the same state as the data signals.

A pattern comparator (216) is used to test and improve transmission across the link that includes clock signal (201) and data lines (217, 219). A predetermined test pattern signal is transmitted on the data lines (217, 219) under the direction of the control signals (227) that are R bits wide. In some embodiments, the test pattern signal may be transmitted for only one cycle. In other embodiments, the test pattern signal may have a duration that lasts for many cycles on one or more of the data lines (217, 219). As mentioned earlier, the test pattern signal is latched by the flip-flops (212, 214) based on the adjustable clock signal (251). The resulting latched test pattern signals on chip_data line 1 (221) through chip_data line V (223) are compared with the predetermined test pattern signal by the pattern comparator (216).

A test circuit is used to improve the link efficiency. The test circuit includes the pattern comparator (216), an adjustment circuit to adjust the adjustable clock signal (251), and test logic (220). In FIG. 2, the adjustment circuit is part of the voltage-controlled delay line (210). The value of the offset signal (215) selects one of several taps in the delay chain of the voltage-controlled delay line (210) to generate the adjustable clock signal (251). The test logic (220) controls and coordinates the activities of the test sequence.

The test logic (220) selects a value of the offset signal (215) to select a timing of the adjustable clock signal (251) relative to the test pattern signals on data line 1 (217) through data line V (219). The latched test pattern signals on chip_data line 1 (221) through chip_data line V (223) are compared with the test pattern signal by the pattern comparator (216) to determine whether the latched test pattern signals are the same as the test pattern signals. The pattern comparator (216) may send comparison results on signal line (225) to the test logic (220) that indicate a pass or fail, or the number of bits that were not the same.

The test logic (220) may select a different value for the offset signal (215) and repeat the transmission of the test pattern signal, latching the test pattern signal, and comparing the test pattern signal to the latched test pattern signal. The pattern comparator (216) sends the results on signal line (225) to the test logic (220). A set of tests with different selected values for the offset signal (215) may indicate a best selected value or a range of selected values for the offset signal (215). The test logic (220) fixes the selected value for the offset signal (215) to improve transmission across the link. Data signals transmitted across the link under non-test conditions may have a higher probability of successful transmission after the value of the offset signal (215) is appropriately selected.

In FIG. 3, an exemplary timing diagram (300) is shown for one clock cycle of a test pattern signal on one data line (301). Multiple offset values are added to a clock signal to generate multiple adjustable clock signals (303, 305, 307, 309, 311, 313, 315) relative to the one clock cycle of the test pattern signal. The test pattern signal is latched according to a rising edge of the adjustable clock signal (303, 305, 307, 309, 311, 313, or 315). A rising edge of each of the multiple adjustable clock signals (303, 305, 307, 309, 311, 313, 315) is indicated by the vertical lines (321, 323, 325, 327, 329, 331, 333), respectively.

Because the adjustable clock signals (303, 305, 313, 315) may jitter and are temporally located near the beginning or end of the test pattern signal transmission, the latched test pattern signal may not be correct (i.e., a fail). Because the adjustable clock signals (307, 309, 311) are temporally located near the middle of the test pattern signal transmission, the latched test pattern signal may be correct (i.e., a pass). The pass (P) or fail (F) condition is shown as comparison results (317). The pass (P) or fail (F) condition for a link may be based on tests of multiple data lines, multiple cycles of test patterns, and/or repeated test patterns.

The testing of a link is performed during the power-on reset of a central processing unit (CPU) or, more generally, an integrated circuit. Once the value for the offset signal has been determined, it is fixed for the duration of the CPU operation until power is removed or cycled. As the communication system characteristics change due to temperature, voltage, and/or aging effects, the value for the offset signal may not maintain a desired temporal position for the adjustable clock signal to latch the incoming data.

SUMMARY OF INVENTION

According to one aspect of the present invention, a communication system comprises a plurality of links where each link comprises a data line adapted to transmit a data signal and a clock line adapted to transmit a clock signal; a first latch device arranged to latch a signal on the data line of at least one of the plurality of links; and a first test circuit operatively connected to the plurality of links where the first test circuit tests at least the one of the plurality of links, the first test circuit comprises a first adjustment circuit arranged to generate a first adjustable clock signal from the clock signal of the one of the plurality of links being tested where the first adjustment circuit adjusts a timing of the first adjustable clock signal relative to the data signal of the one of the plurality of links being tested where the first latch device is responsive to the first adjustable clock signal, and a first pattern comparator arranged to compare a first latched test pattern signal to a first test pattern signal where the first latched test pattern signal comprises the first test pattern signal latched from the data line of the one of the plurality of links by the first latch device where the first test circuit is adapted to perform a round-robin testing of the plurality of the links.

According to one aspect of the present invention, a communication system updating method comprises testing a first adjustable clock signal for one of a plurality of links comprises transmitting a first test pattern signal on a data line of the one of the plurality of links, latching the first test pattern signal based on the first adjustable clock signal to generate a first latched test pattern signal, comparing the first latched test pattern signal to the first test pattern signal, adjusting a first offset of the first adjustable clock based on the comparing of the first latched test pattern signal to the first test pattern signal; and round-robin testing each of the plurality of links.

According to one aspect of the present invention, a communication system comprises means for testing an adjustable clock signal for one of a plurality of links comprises means for transmitting a test pattern signal on a data line of the one of the plurality of links, means for latching the test pattern signal based on the adjustable clock signal to generate a latched test pattern signal, means for comparing the latched test pattern signal to the test pattern signal, means for adjusting an offset of the adjustable clock based on the comparing; and means for round-robin testing each of the plurality of links.

Other aspects and advantages of the invention will be apparent from the following description and the appended claims.

DETAILED DESCRIPTION

Embodiments of the present invention relate to a communication system having multiple, parallel links. Each link includes at least one data line and a clock signal line. On each link, a data signal on the at least one data line is transmitted along with a clock signal on the clock signal line (i.e., source synchronous transmission). A test circuit connected to each link adjusts the timing of a delayed copy of the clock signal to determine when the data signal should be latched. A predetermined test pattern is used to identify which bits are not correctly latched. The communication system is arranged so that each link is tested. The delay of the clock signal is updated in a round-robin fashion.

Figure 1:
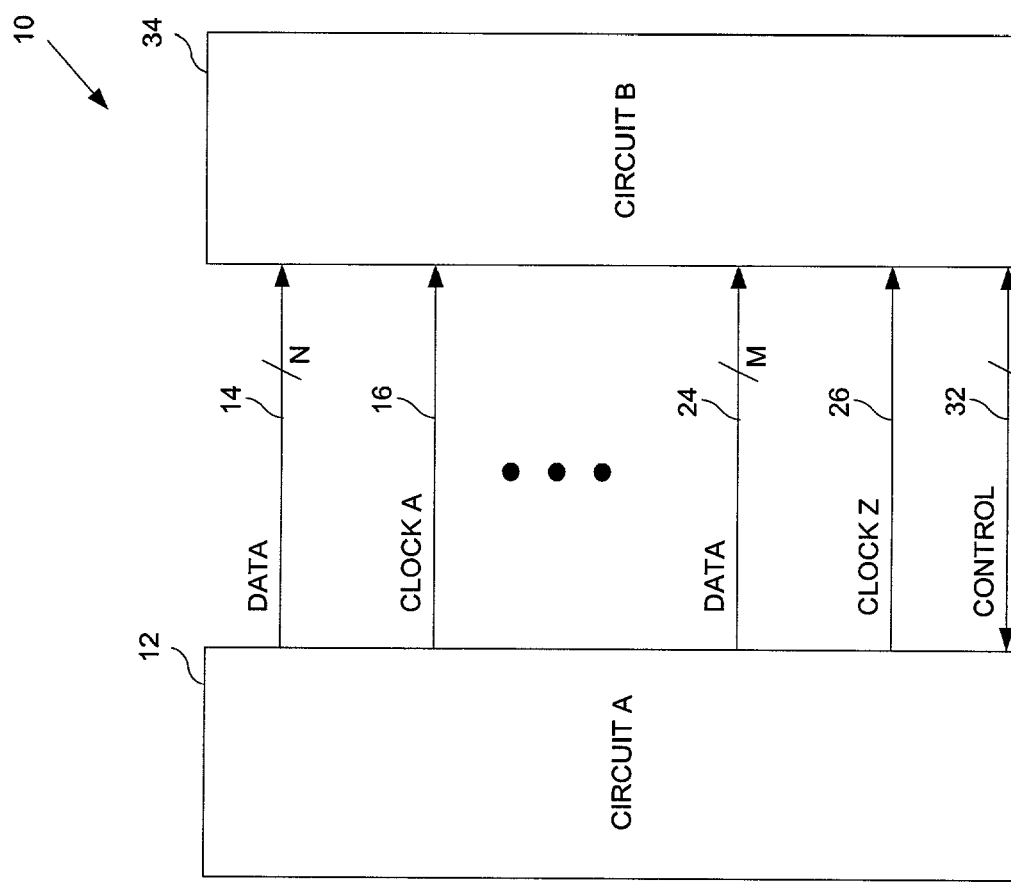
FIG. 1 shows a block diagram of a conventional communication system.
Figure 2:
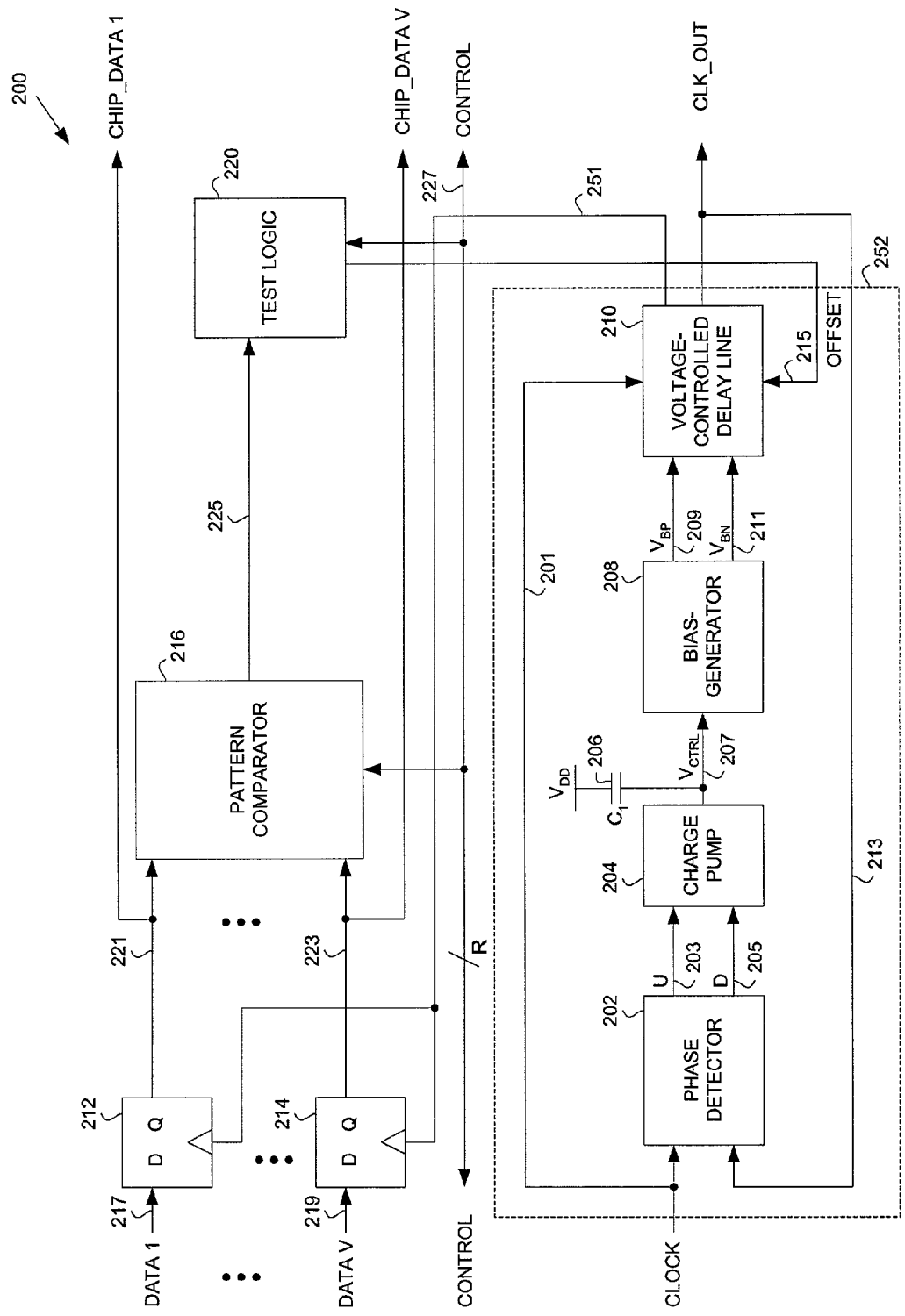
FIG. 2 shows a block diagram of a conventional receiver.
Figure 3:
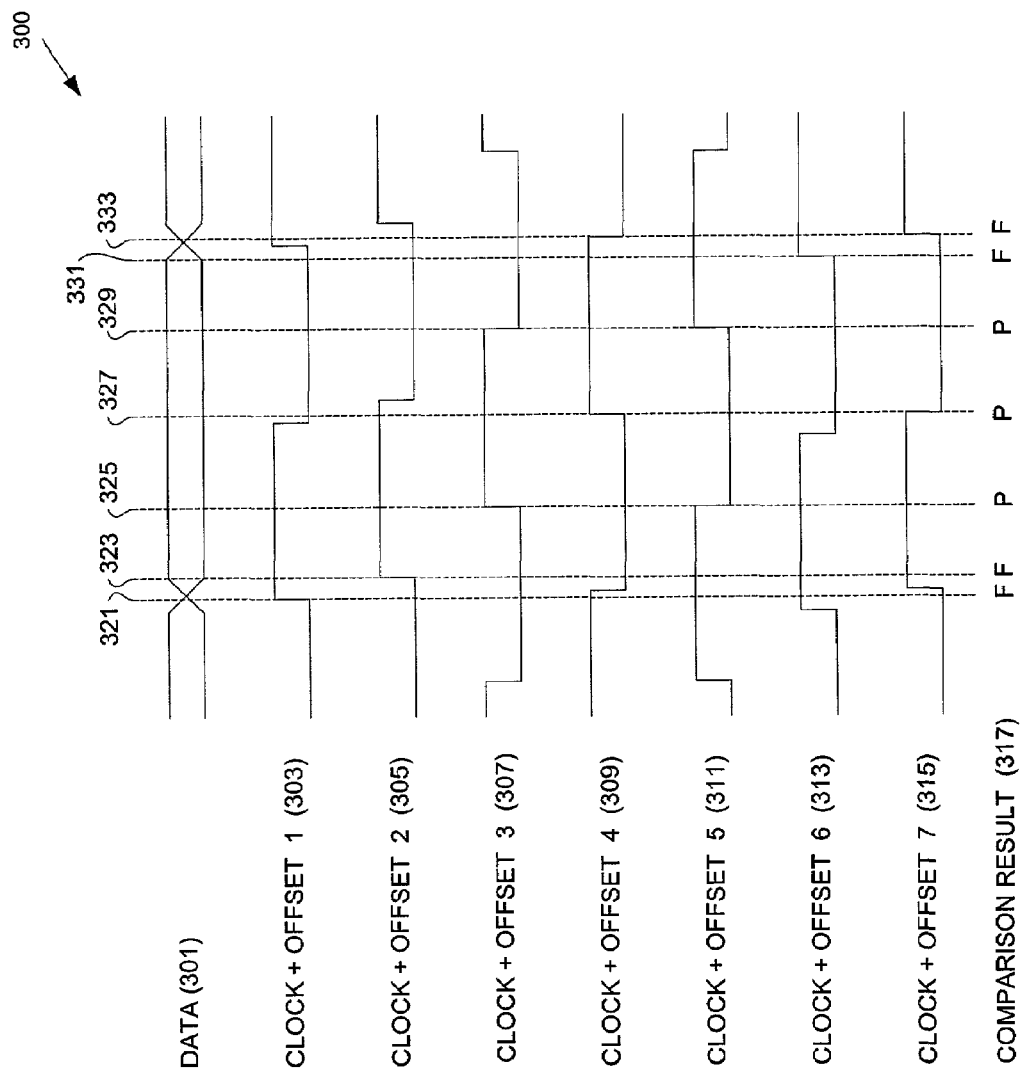
FIG. 3 shows a timing diagram for one data line of a conventional communication system.
Figure 4:
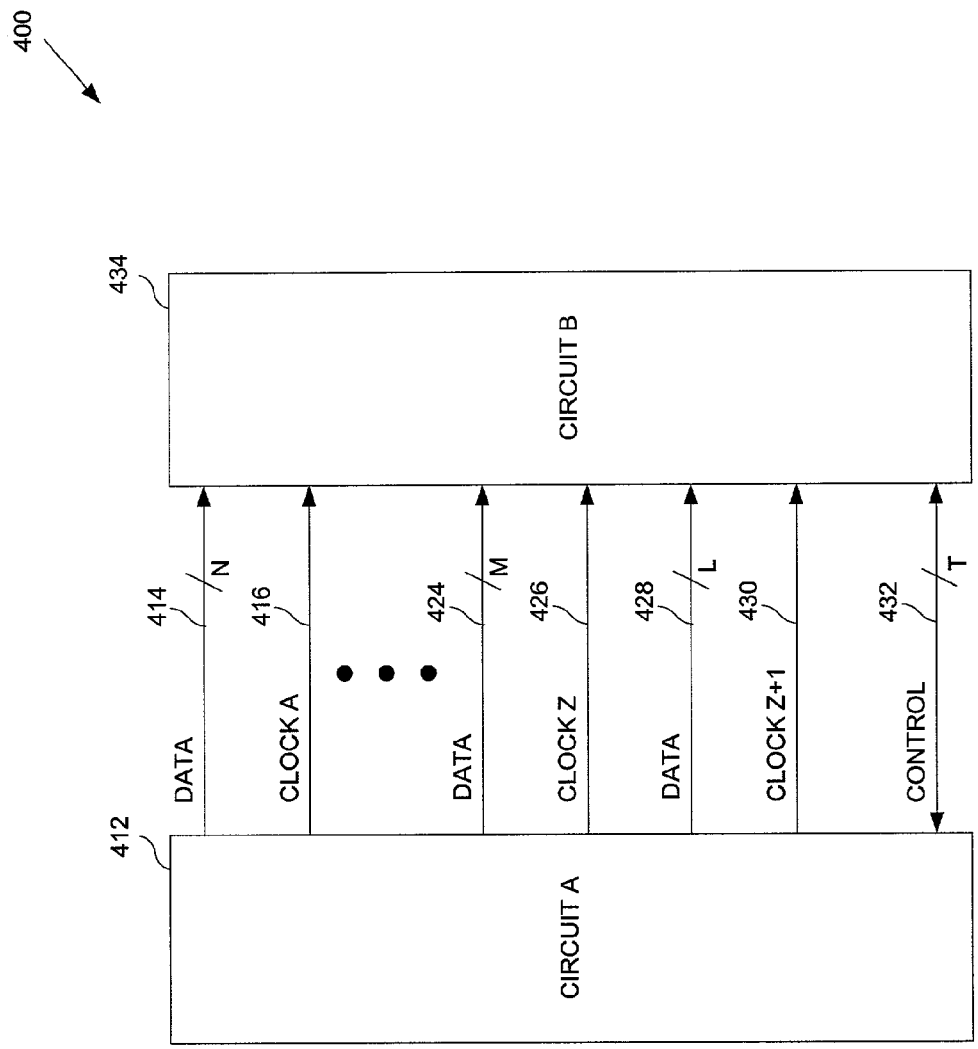
FIG. 4 shows a block diagram of a communication system in accordance with an embodiment of the present invention.

FIG. 4 shows a block diagram of a communication system (400) in accordance with an embodiment of the present invention. The communication system (400) includes multiple links. Each link may include multiple data lines and an associated clock line. Data lines (414) that are N bits wide connects between circuit A (412) and circuit B (434). To aid in the recovery of transmitted data on the data lines (414), a clock signal on a clock A line (416) is also transmitted with the data signals on the data lines (414). Another link includes data lines (424) that are M bits wide and a clock Z line (426). A clock signal on the clock Z line (426) is transmitted with the data signals on the data lines (424) to determine when the data signals on the data lines (424) should be latched. A DLL for each of the links allows a copy of the clock signals (416, 426) to be properly aligned to latch the data signals on the data lines (414, 424), respectively.

According to the requirements of the communication system (400), the multiple links that include data lines (414) and clock A line (416) through data lines (424) and clock Z line (426) are sufficient to transfer information from circuit A (412) to circuit B (434). An additional link is added in excess of the links required to transmit sufficient information between the two circuits (412, 434) in accordance with an embodiment of the present invention. The additional link includes data lines (428) that are L bits wide to transmit information from circuit A (412) to circuit B (434), and a clock line (430) to transmit a clock signal Z+1 with the data signals on the data lines (428). A DLL for the link allows a copy of the clock Z+1 signal (430) to be properly aligned to latch the data signals (428).

The data signals and clock signals for the links in FIG. 4 transmit information from circuit A (412) to circuit B (434) under the direction of control signals on control lines (432). The control signals are transmitted between circuit A (412) and circuit B (434) on control lines (432) that are T bits wide. The control signals may determine on which cycle, what frequency, and/or under which operating mode the data signals and clock signals should be transmitted. The control signals may request that circuit A (412) transmit a predetermined test pattern to circuit B (434) to test and improve transmission on one of the links.

In an embodiment of the present invention, one of the links may be tested to improve transmission on the link, while the remaining links continue to provide the specified transmission bandwidth. Because an additional link is added, one of the other links may be tested without affecting the transmission bandwidth. The L bits of the additional link is sufficient to compensate for any loss of bandwidth due to a link being tested.

The testing of all the links occurs in a round-robin fashion. One of the links is tested while the remaining links provide sufficient transmission bandwidth. After the test circuit has completed testing one of the links, that link may provide transmission bandwidth. Another link may be then be tested. The round-robin testing continues to occur while the communication system is in operation.

Figure 5:
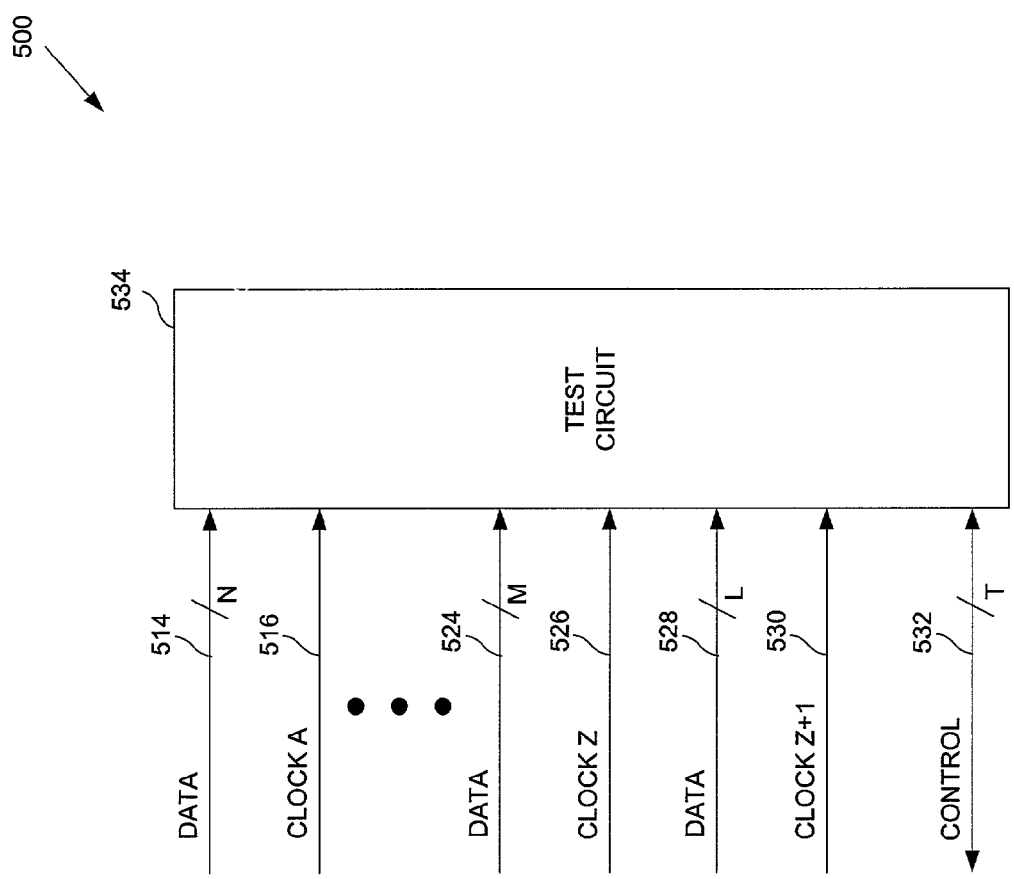
FIG. 5 shows a block diagram of a test circuit in accordance with an embodiment of the present invention.

FIG. 5 shows a block diagram of a test circuit (500) in accordance with an embodiment of the present invention. The test circuit block diagram (500) includes multiple links that are received by a test circuit (534). Data lines (514) that are N bits wide and a clock line A (516) connect to the test circuit (534). To aid in the recovery of transmitted data on the data lines (514), a clock signal on the clock line A (516) is transmitted with data signals on the data lines (514). A DLL for the link allows a copy of the clock A signal on the clock A line (516) to be properly aligned to latch data signals on data lines (514). Another link includes data lines (524) that are M bits wide and a clock line Z (526). A clock signal on the clock line Z (526) is transmitted with data signals on the data lines (524) to determine when data signals on the data lines (524) should be latched. A DLL for the link allows a copy of the clock signal on the clock line Z (526) to be properly aligned to latch data signals on the data lines (524). An additional link includes data lines (528) that are L bits wide and a clock Z+1 line (530). A clock signal on the clock Z+1 line (530) is transmitted with data signals on the data lines (528) to determine when data signals on the data lines (528) should be latched. A DLL for the additional link allows a copy of the clock signal on the clock Z+1 line (530) to be properly aligned to latch data signals on the data lines (528).

The test circuit (534) tests each link in turn using a test pattern signal to determine the best temporal alignment for the copy of the clock signal to latch the data signals. The test circuit (534) is a global test circuit arrangement that can schedule when each link is tested. The test circuit (534) may use control signals on control lines (532) that are T bits wide to coordinate and schedule the testing.

In one or more embodiments, the test circuit (534) using the control lines (532) may change one of the links from transmitting "normal" data (i.e., non-test data) to instead transmitting test pattern signals. In this case, the "normal" data transmitted from the link in question is placed on a different link. The test circuit (534) may maintain at least one of the links to be available for testing at all times.

In one or more embodiments, the test circuit (534) may change which link is being tested based on a counter. The test circuit (534) may decide to test a link, even if it is not the next link in the round-robin sequence, based on the link being idle. The test circuit (534) may decide to test one or more of the links, even if they are not the next link or links in the round-robin sequence, based on a CPU stall. The CPU stall may idle one or more of the links. The test circuit (534) may periodically change which link is being tested based on some timing or activity of the transmitting and receiving circuits (e.g., circuit A (412) and circuit B (434) in FIG. 4).

Figure 6:
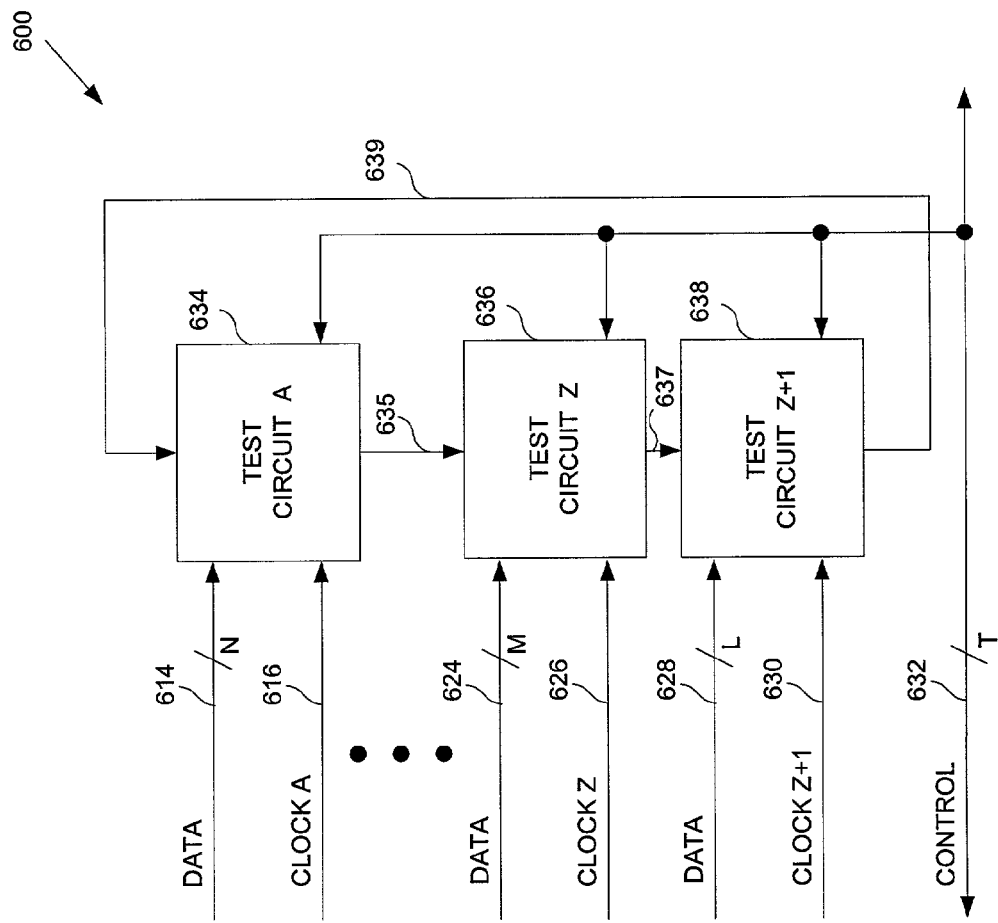
FIG. 6 shows a block diagram of a test circuit in accordance with another embodiment of the present invention.

FIG. 6 shows a block diagram of a test circuit (600) in accordance with an embodiment of the present invention. The test circuit block diagram (600) includes multiple, parallel links that are received by multiple test circuits.

In FIG. 6, data lines (614) that are N bits wide and a clock A line (616) connect to a test circuit A (634). To aid in the recovery of transmitted data on the data lines (614), a clock signal on the clock line A (616) is transmitted with the data signals on data lines (614). A DLL in test circuit A (634) allows a copy of the clock signal on the clock line A (616) to be properly aligned to latch data signals on data lines (614). Another link includes data lines (624) that are M bits wide and a clock line Z (626) that connect to a test circuit Z (636). A clock signal on the clock line Z (626) is transmitted with data signals on the data lines (624) to determine when data signals on the data lines (624) should be latched. A DLL in test circuit Z (636) allows a copy of the clock signal on the clock line Z (626) to be properly aligned to latch data signals on the data lines (624). An additional link includes data lines (628) that are L bits wide and a clock line Z+1 (630) that connect to a test circuit Z+1 (638). A clock signal on the clock line Z+1 (630) is transmitted with data signals on the data lines (628) to determine when data signals on the data lines (628) should be latched. A DLL in test circuit Z+1 (638) allows a copy of the clock signal on the clock line Z+1 (630) to be properly aligned to latch data signals on the data lines (628).

In one or more embodiments, the test circuits (634, 636, 638) may only test their associated link. The test circuits (634, 636, 638) use a test pattern signal to determine the best temporal alignment for the copy of the associated clock signal to latch the associated data signals. The test circuit A (634) using control signals on control lines (632) that are T bits wide coordinates and schedules the testing of its link. The test circuit A (634) using the control lines (632) may change its link from transmitting "normal" data to instead transmitting test pattern signals. After the test circuit A (634) has completed its testing and updated its offset signal value, the link may resume transmitting "normal" data. The signal line (635) is used to indicate that test circuit Z (636) may test its link after test circuit A (634) has completed its testing.

In one or more embodiments, the test circuit Z (636) may start coordinating its test of its link when it receives a signal on the signal line (635). In this case, the test circuit Z (636) uses the control signals on the control lines (632) to coordinate and schedule the testing of its link. The test circuit Z (636) functions in a similar manner as test circuit A (634). The testing may start soon after the signal on the signal line (635) is received. In some cases, the testing may be delayed after the signal on the signal line (635) is received by some time increment determined by a counter, until the link becomes idle, until a CPU stall occurs, or based on some period of time. The test pattern used by test circuit A (634) may or may not be the same test pattern used by test circuit Z (636). The signal line (637) is used to indicate that test circuit Z+1 (638) may test its link after test circuit Z (636) has completed its testing.

The test circuit Z+1 (638) may start coordinating its test of its link when it receives a signal on the signal line (637). The test circuit Z+1 (638) uses the control signals on the control lines (632) to coordinate and schedule the testing of its link. The test circuit Z+1 (638) functions in a similar manner as test circuit A (634) and test circuit Z (636). The testing may start soon after the signal on the signal line (637) is received. In some cases, the testing may be delayed after the signal on the signal line (637) is received by some time increment determined by a counter, until the link becomes idle, until a CPU stall occurs, or based on some period of time. The test pattern used by test circuit Z (636) may or may not be the same test pattern used by test circuit Z+1 (638). The signal line (639) is used to indicate that test circuit A (634) may test its link after test circuit Z+1 (638) has completed its testing.

One of ordinary skill in the art will appreciate that control signals may be used in place of signal lines (635, 637, 639) to determine when each of the test circuits (634, 636, 638) should test their associated links. The control signals on control lines (632) indicate to the transmitting and receiving circuits (e.g., circuit A (412) and circuit B (434) in FIG. 4) which links are under test and which links may transmit "normal" data. During certain conditions, for example a CPU stall, more than one test circuit (634, 636, 638) may be test its link.

One of ordinary skill in the art will appreciate that a test circuit (634, 636, 638) may be associated with one or more links of the multiple, parallel links.

Figure 7:
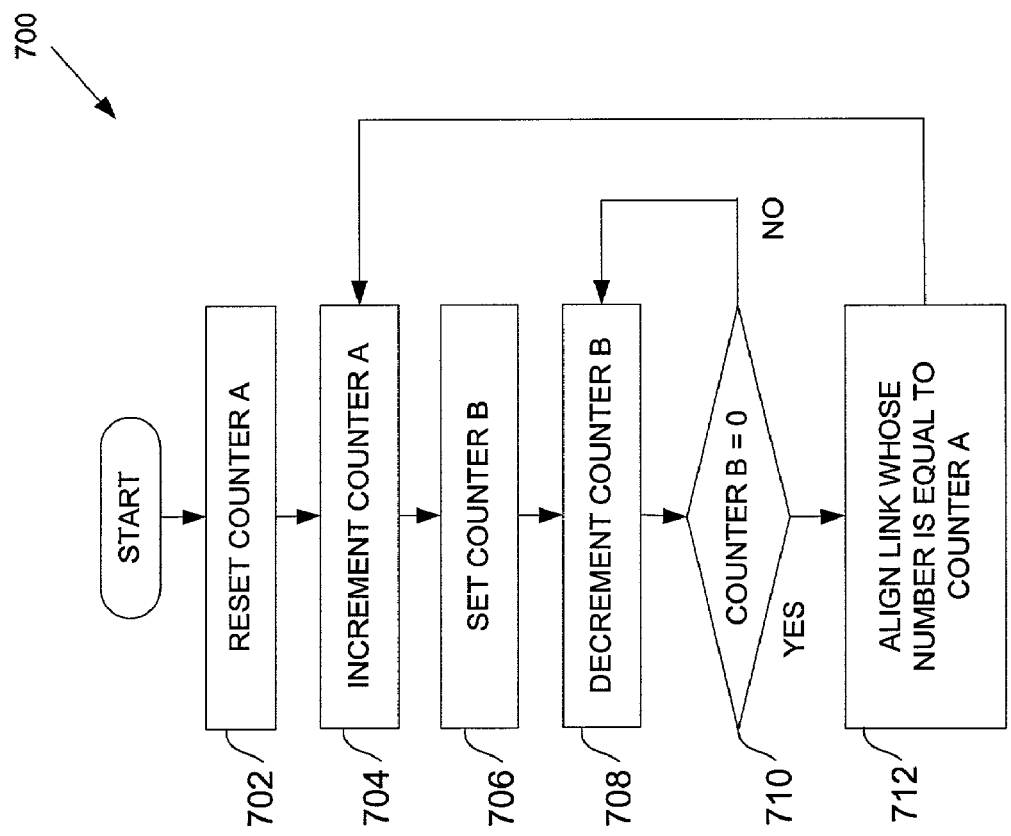
FIG. 7 shows a flow diagram in accordance with an embodiment of the present invention.

FIG. 7 shows a flow diagram (700) in accordance with an embodiment of the present invention. The flow diagram (700) shows a technique for implementing round-robin testing. A counter_A maintains a reference to one of the links. The counter_A is initially reset to a known starting value at (702). The number of bits in counter_A may represent a power of two number of links. In other words, links=$2^{number\ of\ bits\ in\ counter}-A$. If the number of links is not a power of two, the counter is designed to roll over to a one after a number, representative of the maximum number of links in the communication system, has been reached. The value in counter_A is incremented at (704).

In FIG. 7, counter_B determines a minimum number of cycles that should occur between tests of the links. Counter_B is set with the number of cycles that should at least occur between tests of the links at (706). Counter_B is decremented by one at (708). Counter_B is compared to zero at (710). If counter_B has not decremented to zero, counter_B is again decremented by one on the next cycle at (708). If counter_B has decremented to zero, the link identified by counter_A is tested to align the clock associated with the link to an appropriate temporal position relative to the transmitted data associated with the link at (712).

After the test of the link at (712), counter_A is incremented to the next value, or if counter_A has reached a value equal to the maximum number of links, counter_A is reset to one.

When the counter_B has decremented to zero, the alignment of the link identified by counter_A may not occur immediately. The link identified by counter_A may continue to transmit "normal" data until the stream of "normal" data has completed. The stream of "normal" data may include the contents of a buffer or series of registers that hold data that is expected to be transmitted.

The alignment of the link identified by counter_A may wait until the link naturally becomes idle, a CPU stall occurs that may idle one or more of the links, or wait some additional period of time before testing the link. The alignment of the link may be skipped and another link can be tested.

Advantages of embodiments of the present invention may include one or more of the following. In one or more embodiments, because a link may be adjusted to align the link's clock edge relative to the link's data, the link may transmit data with fewer erroneous bits. The testing may occur for multiple links to ensure that all the links may transmit data with fewer erroneous bits.

In one or more embodiments, because an additional link is added to the number of links necessary to support a maximum transmission bandwidth, a link may be periodically tested to align the associated clock with the data for that link. Multiple links may be tested in a round-robin fashion without losing the minimum specified transmission bandwidth. Even though round-robin testing is enabled, the testing of any particular link may be skipped occasionally. Skipping a particular link may occur in favor of a link that is available for testing.

In one or more embodiments, testing of one or more links may occur not just on the initial power-up of the integrated circuit, but also on a periodic basis throughout the time the integrated circuit is in operation. Because all the links may be periodically tested, any change in the characteristics of the communication system due to temperature, voltage, and/or aging effects is observed and the links appropriately adjusted.

In one or more embodiments, under the direction of control signals, a link that is transmitting "normal" data may complete transmitting its current buffered data and allow transmission of test pattern signals. Additional "normal" data that may be scheduled to transmit on that link may be transmitted on a different link.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A communication system, comprising:
   a plurality of links wherein each link comprises a data line arranged to transmit a data signal and a clock line arranged to transmit a clock signal;
   a first latch device arranged to latch a signal on the data line of at least one of the plurality of links; and
   a first test circuit operatively connected to the plurality of links, wherein the first test circuit tests at least the one of the plurality of links, the first test circuit comprising:
      a first adjustment circuit arranged to generate a first adjustable clock signal from the clock signal of the one of the plurality of links being tested, wherein the first adjustment circuit adjusts a timing of the first adjustable clock signal relative to the data signal of the one of the plurality of links being tested, wherein the first latch device is responsive to the first adjustable clock signal, and
      a first pattern comparator arranged to compare a first latched test pattern signal to a first test pattern signal, wherein the first latched test pattern signal comprises the first test pattern signal latched from the data line of the one of the plurality of links by the first latch device,
   wherein the first test circuit is arranged to perform a round-robin testing of the plurality of the links while the communication system is in operation without affecting a designated transmission bandwidth of the communication system,
   wherein the first test circuit is arranged to output a control signal upon completion of testing the at least one of the plurality of links, and
   wherein, when the first test circuit tests the at least one of the plurality of links, a transmission bandwidth of the communication system is not affected.

2. The communication system of claim 1, further comprising:
   a second latch device arranged to latch a signal on the data line of at least another one of the plurality of links; and
   a second test circuit operatively connected to the plurality of links, wherein the second test circuit tests at least the another one of the plurality of links, the second test circuit comprising:
      a second adjustment circuit arranged to generate a second adjustable clock signal from the clock signal of the another one of the plurality of links being tested, wherein the second adjustment circuit adjusts a timing of the second adjustable clock signal relative to the data signal of the another one of the plurality of links being tested, wherein the second latch device is responsive to the second adjustable clock signal, and
      a second pattern comparator arranged to compare a second latched test pattern signal to a second test pattern signal, wherein the second latched test pattern signal comprises the second test pattern signal latched from the data line of the another one of the plurality of links by the second latch device,
   wherein the second test circuit is arranged to perform a round-robin testing of the plurality of the links dependent on the control signal while the communication system is in operation without affecting a designated transmission bandwidth of the communication system, and
   wherein, when the second test circuit tests at least the another of one of the plurality of links, a transmission bandwidth of the communication system is not affected.

3. The communication system of claim 2, wherein the first test pattern and the second test pattern are identical.

4. The communication system of claim 2, wherein
   the first test circuit is connected to at least a first link of the plurality of links,
   the second test circuit is connected to at least a second link of the plurality of links, and
   the first test circuit is connected to the second test circuit.

5. The communication system of claim 1, wherein the first test circuit is arranged to cause the first test pattern signal to be transmitted on at least one of the plurality of links.

6. The communication system of claim 1, wherein the first test circuit tests at least one of the plurality of links while another of the plurality of links transmits a non-test pattern signal.

7. The communication system of claim 1, wherein the first test circuit tests at least one of the plurality of links based on a counter.

8. The communication system of claim 1, wherein the first test circuit tests at least one of the plurality of links when the at least one of the plurality of links is idle.

9. The communication system of claim 1, wherein the first test circuit tests at least one of the plurality of links when a CPU stall occurs.

10. The communication system of claim 1, wherein the first test circuit tests at least one of the plurality of links periodically.

11. The communication system of claim 1, wherein at least one of the plurality of links is available to be tested at all times.

12. The communication system of claim 1, wherein the first adjustable clock signal is generated from a voltage controlled delay line.

13. The communication system of claim 1, wherein the first adjustable clock signal is generated from a digital delay line.

14. The communication system of claim 1, wherein the first adjustable clock signal is generated from an analog delay line.

15. A communication system updating method, comprising:
   testing a first adjustable clock signal for one of a plurality of links, comprising:
      transmitting a first test pattern signal on a data line of the one of the plurality of links,
      latching the first test pattern signal based on the first adjustable clock signal to generate a first latched test pattern signal, comparing the first latched test pattern signal to the first test pattern signal, adjusting a first offset of the first adjustable clock based on the comparing of the first latched test pattern signal to the first test pattern signal; and round-robin testing each of the plurality of links while the communication system is in operation without affecting a designated transmission bandwidth of the communication system, wherein the round-robin testing comprises generating a control signal upon completion of testing the first adjustable clock signal, wherein, when the one of the plurality of links is tested, a transmission bandwidth of the communication system is not affected.

16. The method of claim 15, further comprising:
dependent on the control signal, testing a second adjustable clock signal for another one of the plurality of links, comprising:
   transmitting a second test pattern signal on a data line of the another one of the plurality of links,
   latching the second test pattern signal based on the second adjustable clock signal to generate a second latched test pattern signal,
   comparing the second latched test pattern signal to the second test pattern signal, and
   adjusting a second offset of the second adjustable clock based on the comparing of the second latched test pattern signal to the second test pattern signal.

17. The method of claim 16, wherein the testing the first adjustable clock signal and testing the second adjustable clock signal do not occur at the same time.

18. The method of claim 15, wherein the testing the first adjustable clock signal occurs when the one of the plurality of links is idle.

19. The method of claim 15, wherein the round-robin testing occurs based on a counter.

20. The method of claim 15, wherein the testing the first adjustable clock signal occurs during a CPU stall.

21. The method of claim 15, wherein the testing the first adjustable clock signal occurs periodically.

22. The method of claim 15, wherein the adjusting the first offset comprises a voltage controlled delay line.

23. The method of claim 15, wherein the adjusting the first offset comprises a digital delay line.

24. The method of claim 15, wherein the adjusting the first offset comprises an analog delay line.

25. A communication system, comprising:
means for testing an adjustable clock signal for one of a plurality of links, comprising:
   means for transmitting a test pattern signal on a data line of the one of the plurality of links,
   means for latching the test pattern signal based on the adjustable clock signal to generate a latched test pattern signal,
   means for comparing the latched test pattern signal to the test pattern signal,
   means for adjusting an offset of the adjustable clock based on the comparing,
   means for generating a control signal to another means for testing upon completion of testing the adjustable clock signal; and
means for round-robin testing each of the plurality of links while the communication system is in operation without affecting a designated transmission bandwidth of the communication system,
wherein, when the one of the plurality of links is tested, a transmission bandwidth of the communication system is not affected.

* * * * *